United States Patent
Oku

(10) Patent No.: US 8,004,440 B2
(45) Date of Patent: Aug. 23, 2011

(54) TRANSIMPEDANCE AMPLIFIER AND ANALOG-DIGITAL CONVERTER CIRCUIT

(75) Inventor: Setsuya Oku, Shiga (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/690,632

(22) Filed: Jan. 20, 2010

(65) Prior Publication Data
US 2010/0194617 A1    Aug. 5, 2010

(30) Foreign Application Priority Data
Feb. 5, 2009  (JP) .................................. 2009-024919

(51) Int. Cl.
*H03M 1/66* (2006.01)
(52) U.S. Cl. ........................................ 341/144; 341/155
(58) Field of Classification Search .................. 341/155, 341/144, 158, 161; 330/3, 1, 310, 294, 260; 327/560, 562
See application file for complete search history.

(56) References Cited

U.S. PATENT DOCUMENTS

| | | | | |
|---|---|---|---|---|
| 5,341,408 | A * | 8/1994 | Melcher et al. | 377/8 |
| 7,417,575 | B2 * | 8/2008 | Sutardja | 341/161 |
| 7,688,134 | B2 * | 3/2010 | Tanomura et al. | 330/109 |
| 7,876,155 | B2 * | 1/2011 | Aroca et al. | 330/260 |

FOREIGN PATENT DOCUMENTS
JP    5-122076    5/1993
* cited by examiner

*Primary Examiner* — Brian Young
(74) *Attorney, Agent, or Firm* — Young & Thompson

(57) ABSTRACT

A transimpedance amplifier according to an exemplary aspect of the present invention includes a first terminal supplied with a first power supply voltage, and a second terminal supplied with a second power supply voltage having a potential lower than that of the first power supply voltage. The transimpedance amplifier outputs a voltage signal that is converted into a binary signal of one of the first power supply voltage and the second power supply voltage, based on an input analog current signal. This makes it possible to reduce a conversion error.

8 Claims, 8 Drawing Sheets

TRANSIMPEDANCE AMPLIFIER AND ANALOG-DIGITAL CONVERTER CIRCUIT

INCORPORATION BY REFERENCE

This application is based upon and claims the benefit of priority from Japanese patent application No. 2009-024919, filed on Feb. 5, 2009, the disclosure of which is incorporated herein in its entirety by reference.

BACKGROUND

1. Field of the Invention

The present invention relates to a transimpedance amplifier and an analog-digital converter circuit.

2. Description of Related Art

Up to now, in the case of inputting an analog signal from a high-voltage drive circuit to a low-voltage digital control circuit, the analog signal of the high voltage system is converted into a binary digital signal by a comparator or the like on the high voltage system side. After that, the digital signal is input to the digital control circuit of the low voltage system through isolation means such as a photocoupler. For this reason, only simple binary error signals indicating a voltage abnormality, for example, can be input to the digital control circuit.

In recent years, in order to achieve more sophisticated control, a technique has been developed in which an analog signal of a high voltage system is converted into a digital signal by an A/D converter on the low voltage system side through isolation means. FIG. 6 shows an optically isolated A/D converter circuit as described above. In the A/D converter circuit, a light-emitting diode (LED) 11 of a high voltage system and a photodiode 12 of a low voltage system are connected to each other through a photocoupler 13 serving as optical isolation means. A transimpedance AMP 14 converts a minute current (e.g., about 0 to 20 μA) from the photodiode 12 into a voltage and outputs the voltage to an A/D converter 15. The A/D converter 15 is, for example, a sequential comparison type A/D converter as disclosed in Japanese Unexamined Patent Application Publication No. 05-122076.

FIG. 7 is a block diagram showing the sequential comparison type A/D converter disclosed in FIG. 1 of Japanese Unexamined Patent Application Publication No. 05-122076. The A/D converter 15 includes a comparator 2, a D/A converter 3, a sequential comparison register 4, and an A/D converter control circuit 5. The operation of the A/D converter 15 will be described below.

The sequential comparison register 4 counts clocks supplied from the A/D converter control circuit 5, and outputs a digital signal DS1, which increases at a constant rate, to the D/A converter 3. The D/A converter 3 converts a digital signal DS2 into an analog voltage and outputs the analog voltage to the comparator 2. The comparator 2 compares a received analog input voltage with an output voltage of the D/A converter 3. When the analog input voltage and the output voltage of the D/A converter 3 are at the same voltage level, an output of the comparator 2 is inverted and the sequential comparison register 4 stops the counting operation. As a result, the voltage rise of the D/A converter 103 is stopped at a voltage equal to the analog input voltage. The value of the sequential comparison register 4 at this time is equal to a value obtained by digital conversion of the analog input voltage, and serves as the output of the A/D converter.

In this case, the photodiode 12, the transimpedance AMP 14, and the A/D converter 15, which are shown in FIG. 6, are integrated into one chip as a light receiving IC for a photocoupler. This leads to great improvements in convenience and reduction in size of a mounting space.

SUMMARY

The present inventor has found a problem as described below, and there has been a demand for a further improvement in accuracy of A/D conversion. In the transimpedance AMP 14 shown in FIG. 6, a minute current (several tens of μA) output from the photodiode 12 needs to be converted with high gain to an amplitude (1 V or more) which can be easily processed by the A/D converter 15. This causes a conversion error.

As the input and output of the transimpedance AMP 14 are more linearly related, the conversion error becomes smaller. However, it is difficult to maintain the linearity due to variations in the manufacture of semiconductor devices, variations in temperature, or the like.

Also in the comparator 2 constituting the A/D converter 15, a conversion error occurs due to variations in production.

FIG. 8 shows an example of the D/A converter 3 which constitutes the A/D converter 15. The D/A converter 3 is an n-bit R-2R ladder type D/A converter. Each digital input is applied through a non-inverting buffer. When the digital input is "1", switches B1 to Bn are switched to a reference voltage Vref side. On the other hand, when the digital input is "0", switches B1 to Bn are switched to the ground side. With this configuration, each digital input can be converted into an analog current. In general, a buffer AMP 16 for converting the obtained analog current into a voltage is added to the output of the D/A converter 3. This causes a conversion error.

Note that the term "conversion error" refers to a variation in production, such as an AMP gain, a variation in temperature, or the like. It is difficult to correct the conversion error by adjustment. That is, a quantization error of the A/D converter is not included in the conversion error.

A first exemplary aspect of the present invention is a transimpedance amplifier including: a first terminal supplied with a first power supply voltage; and a second terminal supplied with a second power supply voltage having a potential lower than that of the first power supply voltage. The transimpedance amplifier outputs a voltage signal that is converted into a binary signal of one of the first power supply voltage and the second power supply voltage, based on an input analog current signal.

According to an exemplary aspect of the present invention, it is possible to provide an optically isolated analog-digital converter circuit capable of reducing a conversion error.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Specific embodiments of the present invention will be described in detail below with reference to the accompanying drawings. Note that the present invention is not limited to embodiments described below. To clarify the explanation, the following description and drawings are simplified as appropriate.

First Exemplary Embodiment

Figure 1:
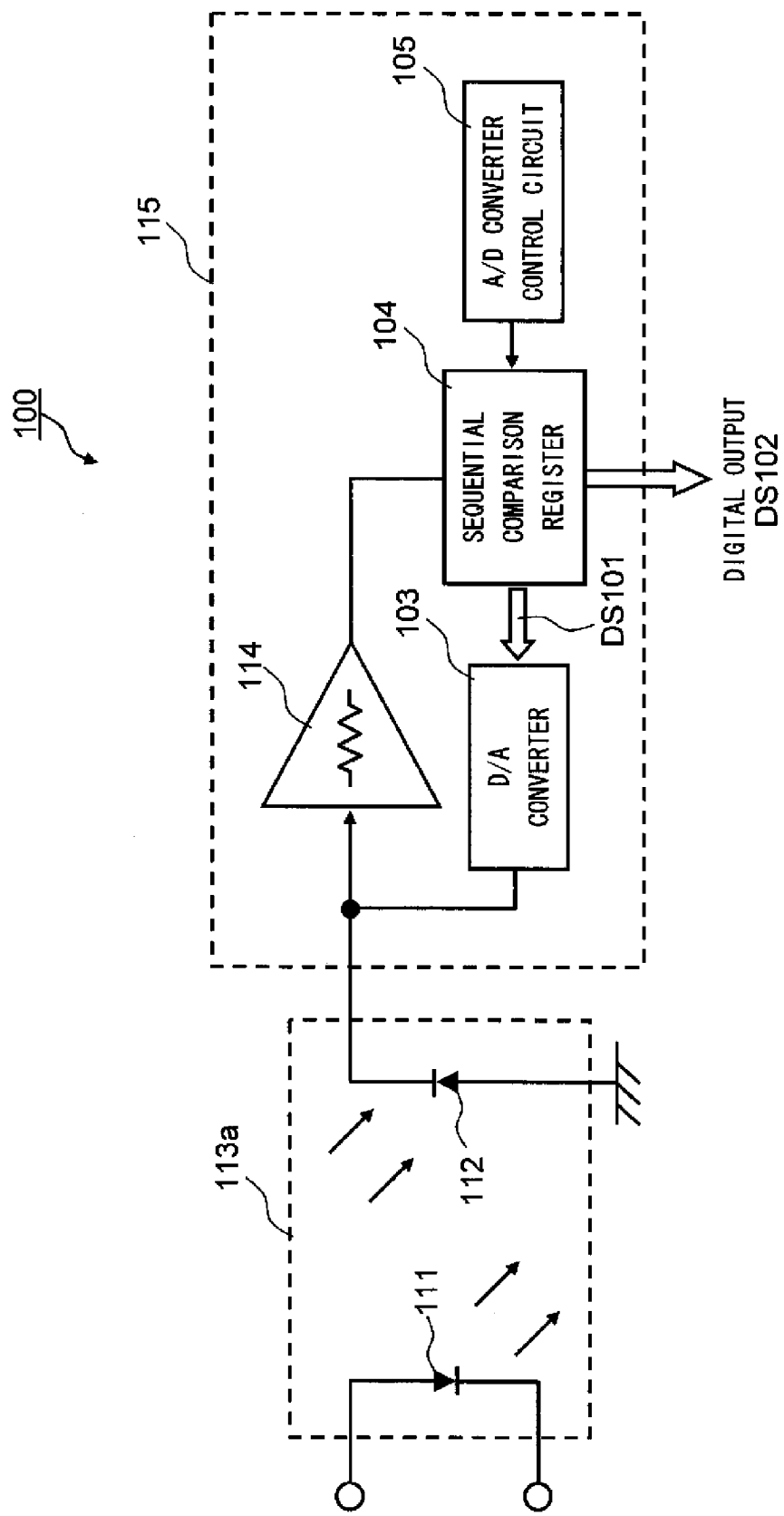
FIG. 1 is a block diagram showing an optically isolated A/D converter circuit according to a first exemplary embodiment of the present invention.

Reference is now made to FIG. 1 which is a block diagram showing an optically isolated analog-digital (A/D) converter circuit according to a first exemplary embodiment of the present invention. An optically isolated A/D converter circuit 100 includes a photocoupler 113a and an A/D converter 115. The photocoupler 113a includes an LED 111 and a photodiode 112. The A/D converter 115 includes a D/A converter 103, a sequential comparison register 104, an A/D converter control circuit 105, and a transimpedance AMP 114.

Figure 2:
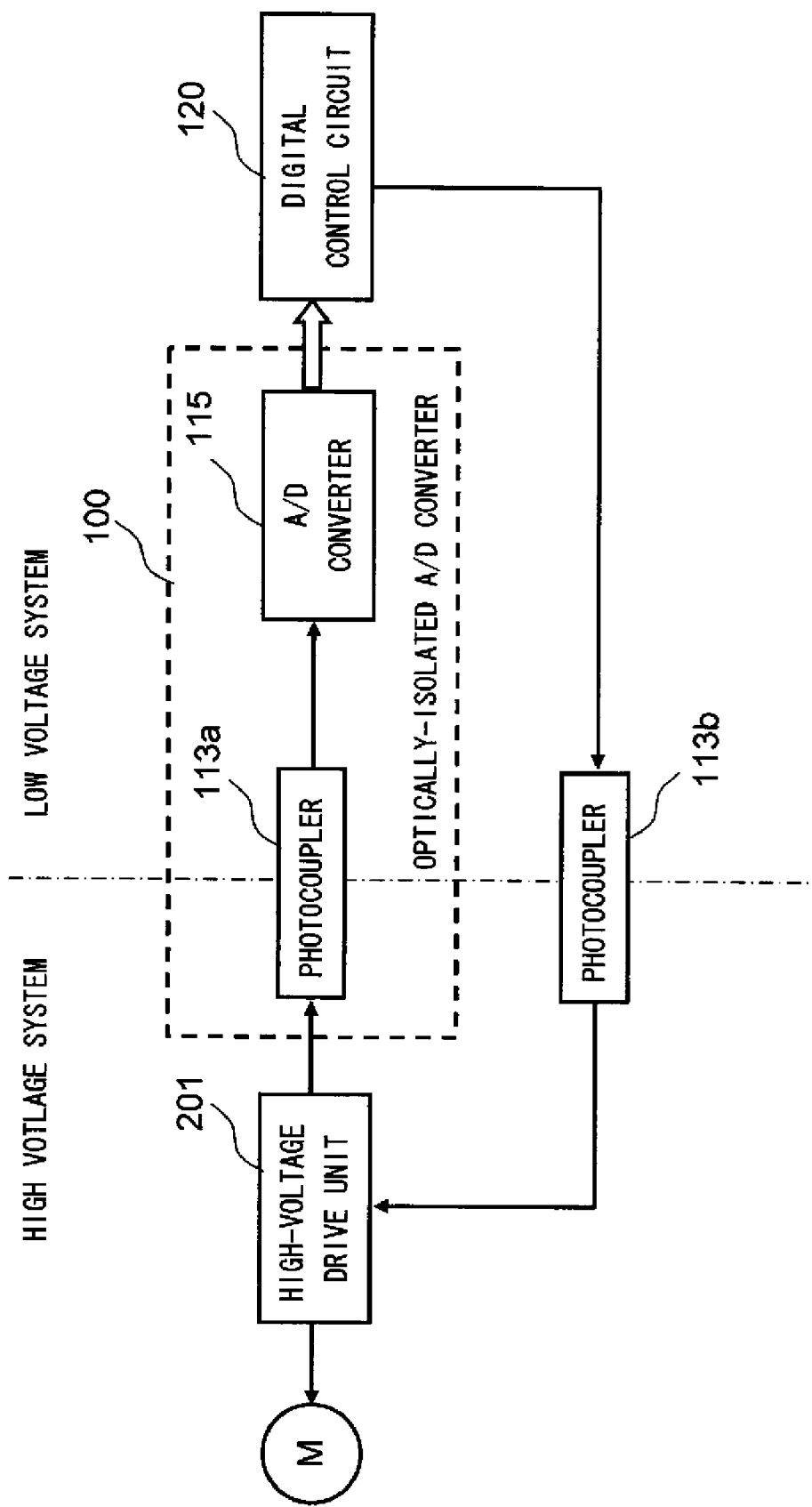
FIG. 2 is a block diagram showing a motor control circuit to which the optically isolated A/D converter circuit according to the first exemplary embodiment is applied.

FIG. 2 is a block diagram showing a motor control circuit to which the optically isolated A/D converter circuit 100 according to the first exemplary embodiment is applied. The motor control circuit includes a high voltage system and a low voltage system. The high voltage system includes a motor M and a high-voltage drive unit 201. Meanwhile, the low voltage system includes the A/D converter 115 and a digital control circuit 120. The high voltage system and the low voltage system are connected to each other through two photocouplers 113a and 113b. The photocoupler 113a and the A/D converter 115 constitute the optically isolated A/D converter circuit 100 shown in FIG. 1.

Referring to FIG. 2, a description is now given of the configuration of the motor control circuit to which the optically isolated A/D converter circuit 100 according to the first exemplary embodiment is applied. The motor M is driven by an analog signal supplied from the high-voltage drive unit 201. Meanwhile, the analog signal of the high voltage system is monitored by the digital circuit 120 of the low voltage system.

For this reason, the analog signal is converted into an optical signal on the high voltage system side of the photocoupler 113a and transmitted to the low voltage system side. Further, the optical signal is converted into a photocurrent on the low voltage system side of the photocoupler 113a. The photocurrent which is an analog signal is converted into a digital signal by the A/D converter 115, and is input to the digital control circuit 120. Then, a control signal output from the digital control circuit 120 is fed back to the high-voltage drive unit 201 through the photocoupler 113b. This configuration enables digital control of the drive operation of the motor M.

Referring again to FIG. 1, a description is next given of the configuration of the optically isolated A/D converter circuit 100 according to the first exemplary embodiment. As described above, the photocoupler 113a includes the LED 111 and the photodiode 112. The LED 111 converts the analog signal of the high voltage system into an optical signal.

Figure 7:
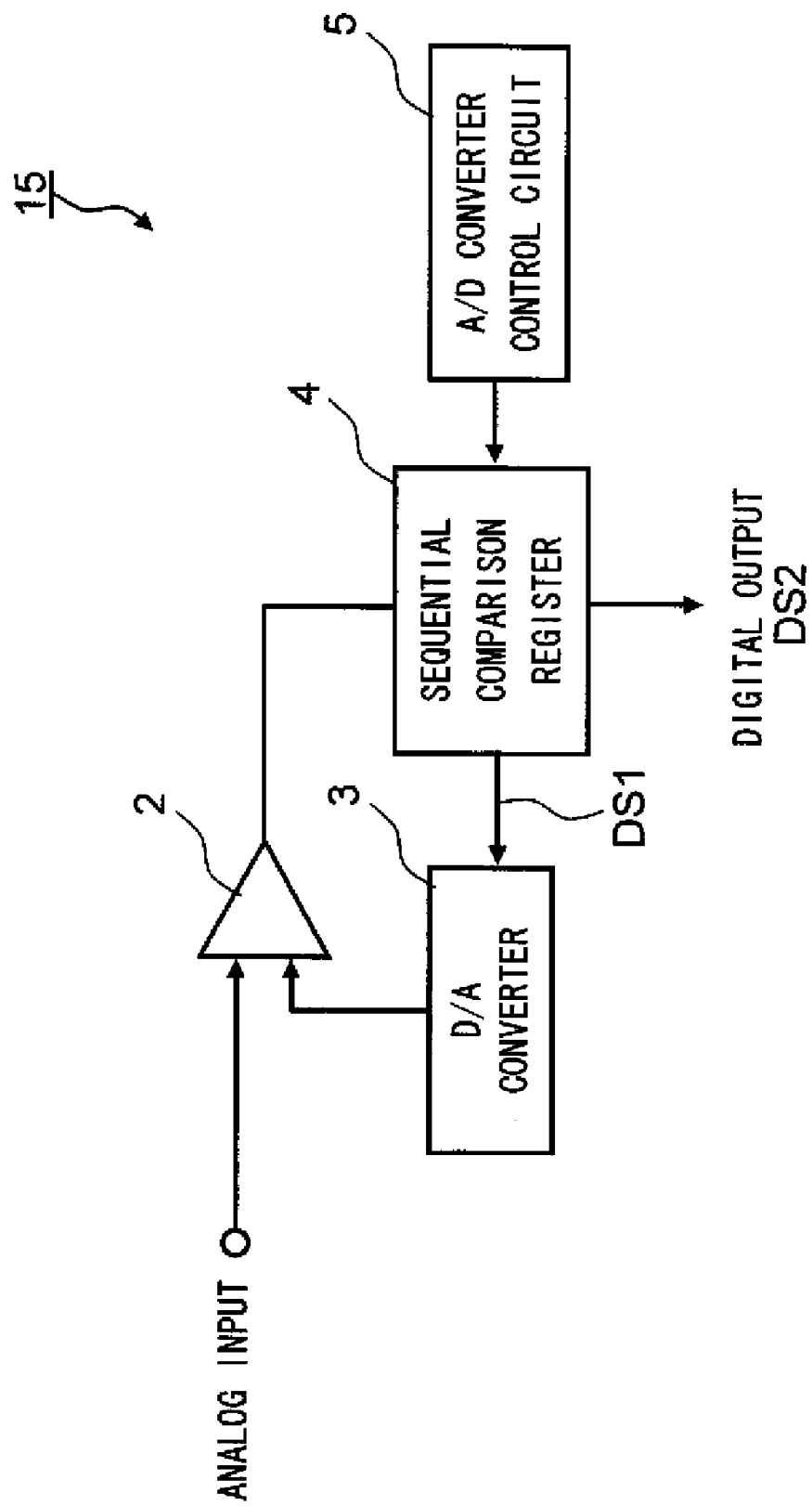
FIG. 7 is a block diagram showing a sequential comparison type A/D converter disclosed in FIG. 1 of Japanese Unexamined Patent Application Publication No. 05-122076.

The photodiode 112 converts the optical signal output from the LED 111 into a photocurrent of the low voltage system. Thus, the photocoupler 113a can convert an electrical signal into an optical signal and transmit the optical signal in an electrically isolated state. The comparator 2 shown in FIG. 7 is not required in the optically isolated A/D converter circuit 100 according to the first exemplary embodiment. This makes it possible to eliminate a conversion error caused by the comparator. The omission of the comparator also contributes to downsizing and a reduction in power consumption and costs.

An output of the photodiode 112 is connected to an input of the transimpedance AMP 114 which constitutes the A/D converter 115. A node between the output of the photodiode 112 and the input of the transimpedance AMP 114 is connected to an output of the D/A converter 103. An output from the transimpedance AMP 114 is input to the sequential comparison register 104. An output from the A/D converter control circuit 105 is also input to the sequential comparison register 104. The sequential comparison register 104 outputs a digital signal DS101 to the D/A converter 103, and also outputs a digital signal DS102 as an output of the A/D converter 115.

Figure 3:
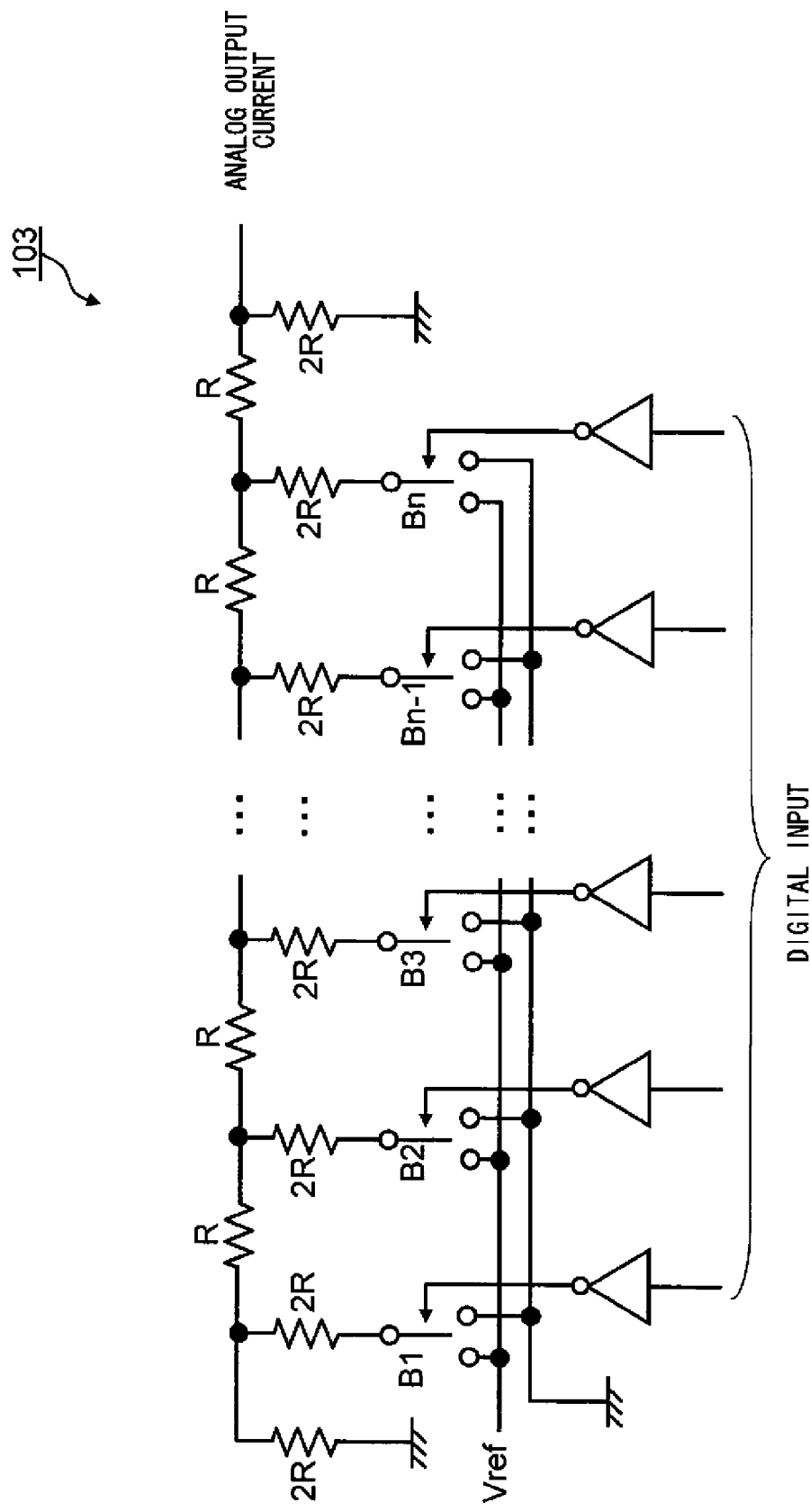
FIG. 3 is a circuit diagram showing a current-output-type D/A converter according to the first exemplary embodiment.
Figure 8:
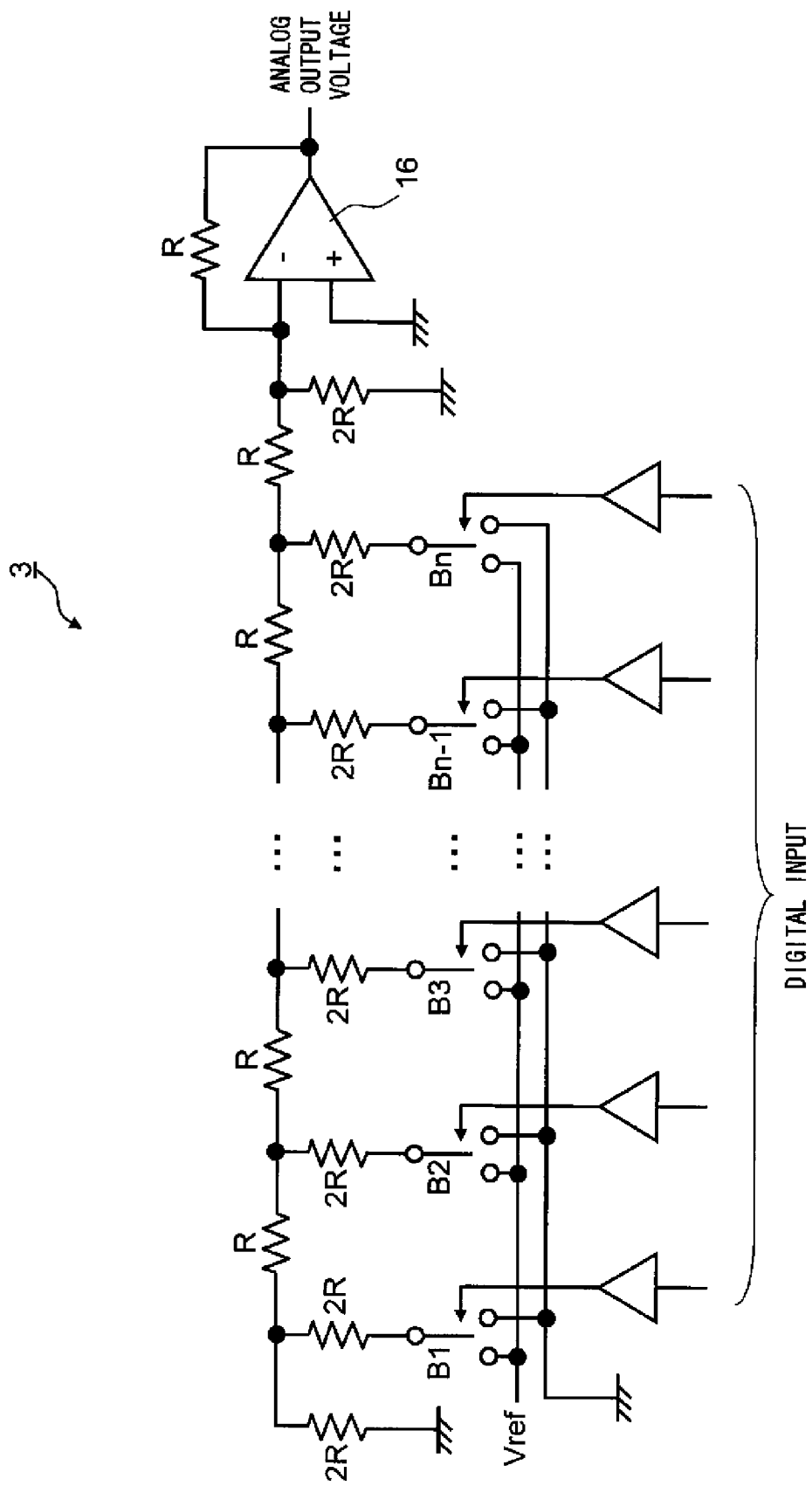
FIG. 8 is a circuit diagram showing a D/A converter according to a related art.

FIG. 3 shows the D/A converter 103 according to this exemplary embodiment. The D/A converter 103 is an n-bit R-2R ladder type D/A converter. Each digital input is applied through an inverting buffer (inverter). When the digital input is "1", switches B1 to Bn are switched to the ground side. On the other hand, when the digital input is "0", switches B1 to Bn are switched to a reference voltage Vref side. With this configuration, each digital input can be converted into an analog current. The analog current is the output of the D/A converter 103. A buffer AMP 16 shown in FIG. 8, which converts the obtained analog current into a voltage, is not required to be added to the output of the D/A converter 103 according to this exemplary embodiment. This makes it possible to eliminate a conversion error caused by the buffer AMP 16. The omission of the buffer AMP 16 also contributes to downsizing and a reduction in power consumption and costs.

Figure 4:
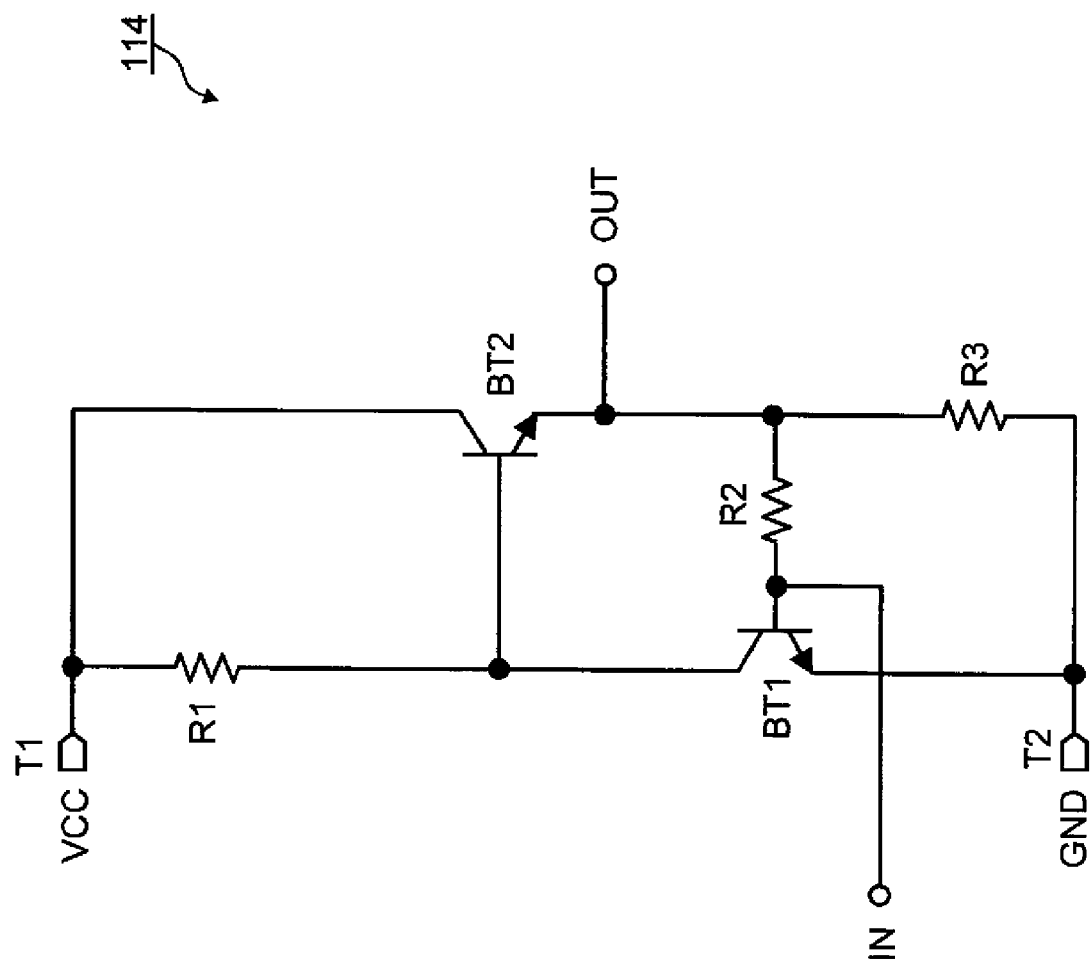
FIG. 4 is a circuit diagram showing a transimpedance AMP according to the first exemplary embodiment.

FIG. 4 is a circuit diagram showing the transimpedance AMP 114 according to the first exemplary embodiment. The transimpedance AMP 114 includes NPN bipolar transistors BT1 and BT2 and resistors R1 to R3.

The collector of the bipolar transistor BT1 is connected to a power supply terminal T1, which is supplied with a power supply voltage VCC, through the resistor R1. The emitter of the bipolar transistor BT1 is connected to a ground terminal T2 which is supplied with a ground voltage GND. The base of the bipolar transistor BT1 is connected to the input IN of the transimpedance AMP 114. The base of the bipolar transistor BT1 is also connected to a node between the resistor R3 and the emitter of the bipolar transistor BT2, through the resistor R2.

The collector of the bipolar transistor BT2 is connected to the power supply terminal T1. The emitter of the bipolar transistor BT2 is connected to the output OUT of the transimpedance AMP 114. The emitter of the bipolar transistor BT2 is also connected to the ground terminal T2 through the resistor R3. The base of the bipolar transistor BT2 is connected to a node between the resistor R1 and the collector of the bipolar transistor BT1.

The gain of the transimpedance AMP 114 is set to a high level so that its amplitude exceeds the power supply voltage VCC. For this reason, though the output of the transimpedance AMP 114 is an analog voltage, the transimpedance AMP 114 outputs a potential which is saturated at the power supply voltage VCC or the ground voltage GND, according to the input current. That is, the transimpedance AMP 114 acts as a comparator. The output voltage is input to the sequential comparison register 104 as a binary signal.

Next, the operation of the A/D converter 115 will be described. The sequential comparison register 104 counts clocks supplied from the A/D converter control circuit 105, and outputs the digital signal DS101, which increases at a constant rate, to the D/A converter 103. The D/A converter 103 converts the digital signal DS101 into an analog voltage, and outputs the analog voltage to the transimpedance AMP 114.

The transimpedance AMP 114 receives a composite current obtained by combining a photocurrent Ipd output from the photodiode 112 with an output current Ida output from the D/A converter 103. When the composite current exceeds a threshold (sensitivity current Is), the output of the transimpedance AMP 114 is inverted and the sequential comparison register 104 stops the counting operation. As a result, the current of the D/A converter 103 stops rising. A value obtained by logically inverting the value of the sequential comparison register 104 at this time is equal to a value obtained by digital conversion of an analog input voltage, and serves as the output of the A/D converter 115.

Figure 5:
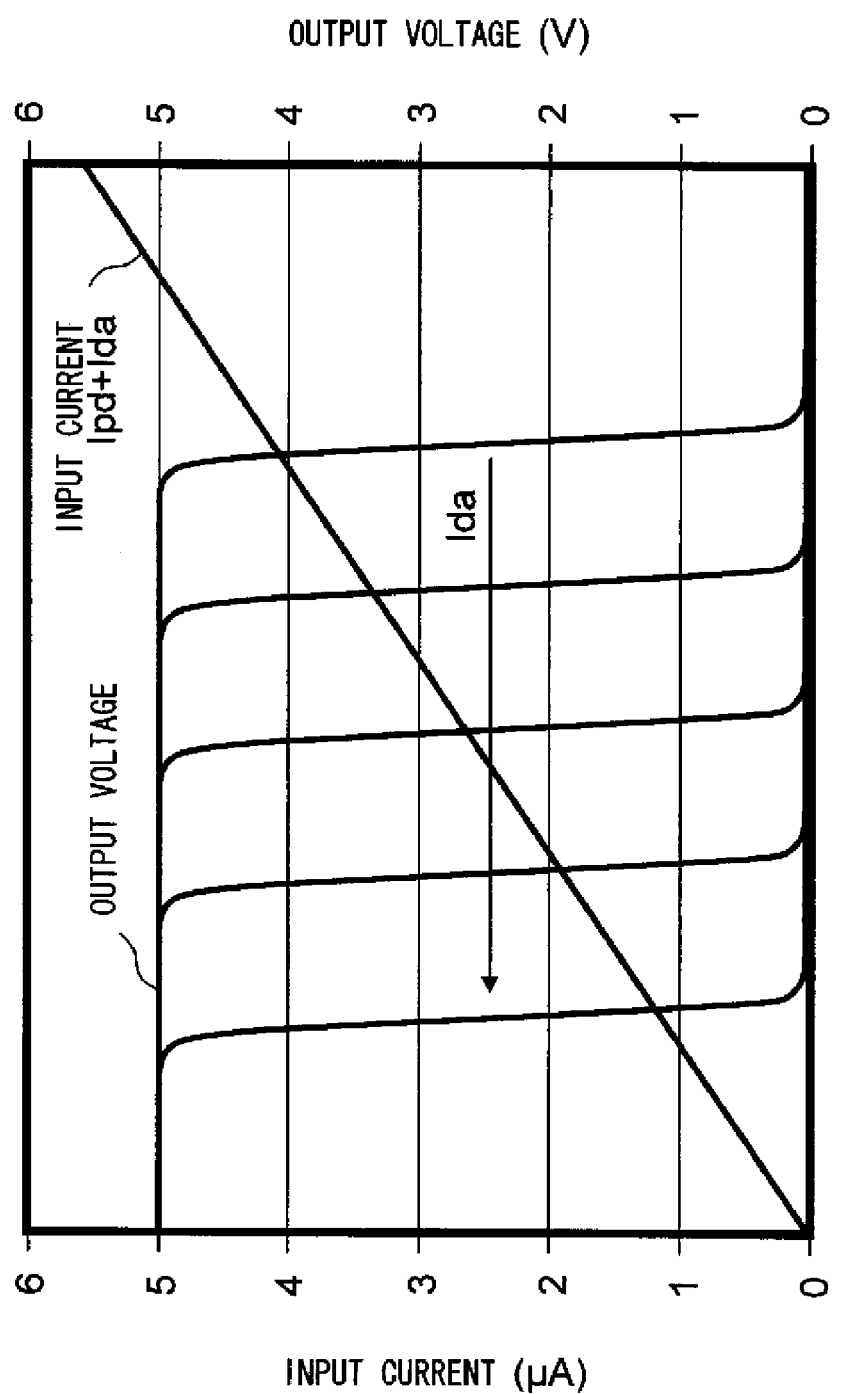
FIG. 5 is an input/output characteristic diagram illustrating operation of the transimpedance AMP.

FIG. 5 is a diagram showing the input/output operation of the transimpedance AMP 114 according to this exemplary embodiment. FIG. 5 shows the output of the transimpedance AMP 114 (i.e., signal input to the sequential comparison register 104) in which five patterns obtained when the output current Ida of the D/A converter 103 is decreased by a predetermined amount (digital value) at regular intervals are plotted in a superimposed manner. Each intersection between an output voltage and an oblique line representing an input current (Ipd+Ida) indicates an input current value for obtaining the output. This also indicates that when the input current is varied at regular intervals, the output is also varied at regular intervals.

In this case, the current value (sensitivity current Is) inverted by the transimpedance AMP 114 depends on the circuit and is constant. Accordingly, at a point where the output is inverted, the following expression (1) is established.

$$Is = Ipd + Ida \quad (1)$$

where Ipd represents a photocurrent of the photodiode 112, and Ida represents an output current of the D/A converter 103.

Therefore, if the current value Ida to be supplied is determined accurately, the current Ipd output from the photodiode 112 can be determined accurately regardless of the characteristics of the transimpedance AMP 114. In this case, Ipd=Is−Ida is obtained from the expression (1), and the sign of the value of the photocurrent Ipd to be obtained and the sign of the value of the output current Ida of the D/A converter 103 are inverted. Accordingly, the value of the digital output of the A/D converter 115 may be obtained by logically inverting the value of the sequential comparison register 104.

Figure 6:
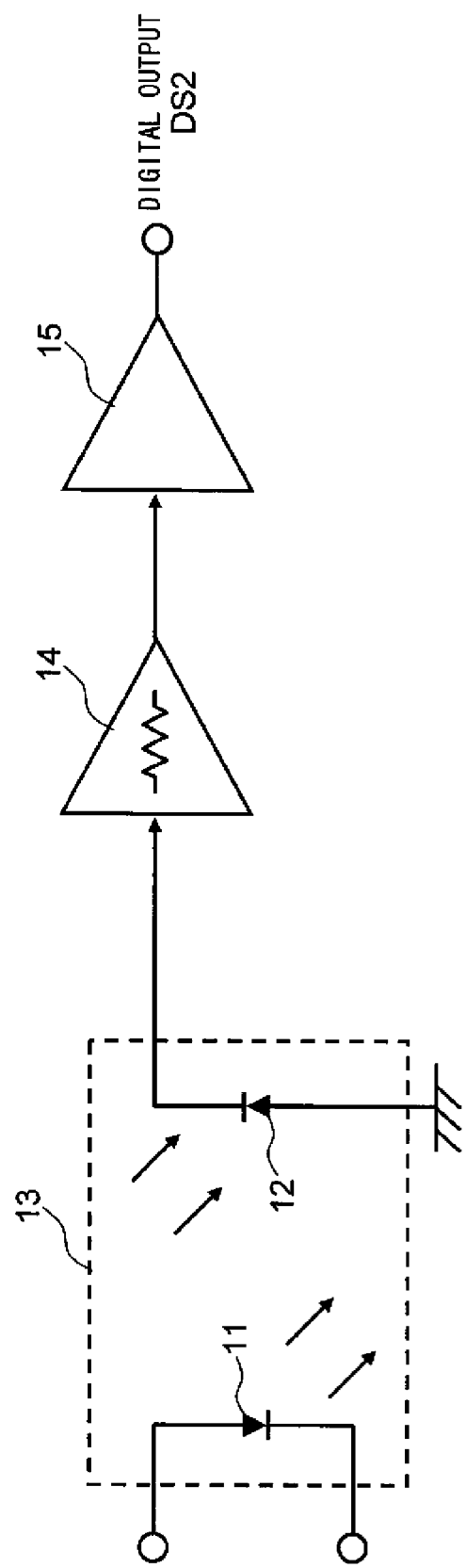
FIG. 6 shows an optically isolated A/D converter circuit according to a related art.

As described above, in the optically isolated A/D converter circuit 100 according to this exemplary embodiment, a photocurrent is not converted into a voltage and the photocurrent is directly subjected to a comparison process by the transimpedance AMP 114. Therefore, compared to the configurations shown in FIGS. 6 to 8, the comparator 2 and the buffer AMP 16 of the D/A converter 3 can be omitted. This makes it possible to reduce a conversion error. Moreover, downsizing and a reduction in power consumption and costs can be realized.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A transimpedance amplifier comprising:
    a first terminal supplied with a first power supply voltage; and
    a second terminal supplied with a second power supply voltage having a potential lower than that of the first power supply voltage,
    wherein the transimpedance amplifier outputs a voltage signal that is converted into a binary signal of one of the first power supply voltage and the second power supply voltage, based on an input analog current signal, and
    the input analog current signal is a composite current signal of an analog current signal to be measured and an analog reference current signal serving as a reference signal.

2. The transimpedance amplifier according to claim 1, further comprising a bipolar transistor having a base that receives the input analog current signal.

3. An analog-digital converter circuit comprising:
    a photodiode that generates an analog current signal based on a received optical signal;
    a digital-analog converter that generates an analog reference current signal from a digital signal;
    a transimpedance amplifier that outputs a binalized voltage signal based on a composite current signal of the analog current signal and the analog reference current signal; and
    a register that receives a binalized signal output from the transimpedance amplifier.

4. The analog-digital converter circuit according to claim 3, wherein
    the transimpedance amplifier comprises:
        a first terminal supplied with a first power supply voltage; and
        a second terminal supplied with a second power supply voltage having a potential lower than that of the first power supply voltage, and
        the transimpedance amplifier outputs a voltage signal that is converted into a binary signal of one of the first power supply voltage and the second power supply voltage, based on the composite current signal.

5. The analog-digital converter circuit according to claim 3, wherein the transimpedance amplifier comprises a bipolar transistor having a base that receives the composite current signal.

6. The analog-digital converter circuit according to claim 3, further comprising a light-emitting diode that generates the optical signal,
    wherein the light-emitting diode and the photodiode constitute a photocoupler.

7. The analog-digital converter circuit according to claim 3, wherein the digital-analog converter is an R-2R ladder type digital-analog converter.

8. An analog-digital converter circuit comprising:
    a photodiode that generates an analog current signal based on a received optical signal;
    a digital-analog converter that generates an analog reference current signal from a digital signal; and
    a transimpedance amplifier that outputs a binalized voltage signal based on a composite current signal of the analog current signal and the analog reference current signal,
    wherein the transimpedance amplifier comprises a bipolar transistor having a base that receives the composite current signal.

* * * * *